(12) United States Patent
Organ et al.

(10) Patent No.: US 6,768,960 B2
(45) Date of Patent: Jul. 27, 2004

(54) SYSTEM FOR AND METHOD OF PERFORMING DEVICE-ORIENTED TESTS

(75) Inventors: Don Organ, Saratoga, CA (US); Mark Deome, San Jose, CA (US); Jeff Perkins, Cambridge, MA (US); Bob Quinn, San Jose, CA (US); Juliekara Techasaratoole, San Jose, CA (US)

(73) Assignee: LTX Corporation, Westwood, MA (US)

(*) Notice: Subject to any disclaimer, the term of this patent is extended or adjusted under 35 U.S.C. 154(b) by 96 days.

(21) Appl. No.: 09/863,178

(22) Filed: May 23, 2001

(65) Prior Publication Data

US 2002/0177968 A1 Nov. 28, 2002

(51) Int. Cl.[7] .............................................. G06F 19/00
(52) U.S. Cl. ...................................... 702/118; 324/763
(58) Field of Search ........................ 702/118–122, 188; 324/527–528, 537, 763–764; 340/286.13, 286.14

(56) References Cited

U.S. PATENT DOCUMENTS

| | | | | |
|---|---|---|---|---|
| 4,810,958 A | * | 3/1989 | Mogi et al. ................. | 702/118 |
| 5,963,735 A | * | 10/1999 | Sample et al. ................ | 703/24 |
| 6,002,868 A | * | 12/1999 | Jenkins et al. ............... | 717/105 |
| 6,098,027 A | * | 8/2000 | Yang ........................... | 702/118 |
| 6,098,028 A | * | 8/2000 | Zwan et al. ................. | 702/120 |
| 6,263,295 B1 | * | 7/2001 | Morgan ...................... | 702/117 |
| 6,269,319 B1 | * | 7/2001 | Neisch et al. ............... | 702/118 |

* cited by examiner

Primary Examiner—Marc S. Hoff
Assistant Examiner—Mary Catherine Baran
(74) Attorney, Agent, or Firm—McDermott, Will & Emery LLP (57) ABSTRACT

A method of connecting one or more testing devices to ports of a DUT through a switching network, to execute a testing procedure includes generating a switching network map defining connections within the switching network to implement electrical paths through the switching network. Each of the electrical paths is representative of a connection of one of the testing devices to one of the I/O ports of the DUT. The method further includes receiving commands that uniquely specify an electrical path connecting a particular testing device to a particular I/O port of the DUT. The method compares each command to the switching network map to identify a corresponding electrical path through the switching network, and implements that path associated the command through the network. The method further includes sequentially implementing the electrical paths corresponding to the one or more commands in a predetermined order.

11 Claims, 6 Drawing Sheets

| | PIN NAME | FULLY QUALIFIED NAME | SCM POGO PIN | | TESTER RESOURCE | | COMMENT |
|---|---|---|---|---|---|---|---|
| | | | SITE 1 | SITE 2 | SITE 1 | SITE 2 | |
| ROW 1 | D0 | D0.DP.DP | | | D1 | D3 | D0 DEFAULTS TO THE FIRST DUT BOARD CONNECTION (DP) AND THE FIRST SCM CONNECTION (DP). |
| ROW 2 | D0.DP | D0.DP.DP | | | D1 | D3 | D0.DP SPECIFIES THE DP DUT BOARD CONNECTION. IT THEN DEFAULTS TO THE FIRST SCM CONNECTION (DP). |
| ROW 3 | D0.DP.DP | D0.DP.DP | | | D1 | D3 | FULLY SPECIFIED NAME |
| ROW 4 | D0.CPMU | D0.DP.CPMU | | | D1 | D3 | CPMU CONNECTION VIA D1/D3. SEE SECTION "CPMU CONNECTION" ON PG. 5 FOR MORE DETAILS ON THE CPMU. THE DP NAME IS NOT NECESSARY SINCE THERE IS ONLY ONE CPMU SCM CONNECTION NAME. |
| ROW 5 | D0.F_10 MHZ | D0.X1.F_10 MHZ | S_SMS1 | S_SMS3 | SMS1 | SMS3 | THE X1 DUT BOARD CONNECTION IS USED AS IT IS THE ONLY ONE TO F_10 MHZ |
| ROW 6 | D0.X1 | D0.X1.F_10 MHZ | S_SMS1 | S_SMS3 | SMS1 | SMS3 | THE X1 CONNECTION DEFAULTS TO THE FIRST SCM CONNECTION WHICH IS F_10 MHZ |
| ROW 7 | D0.AP | D0.X10.AP | S_SMS1 | S_SMS3 | AP1 | AP3 | THE ONLY AP CONNECTION IS VIA X10 |
| ROW 8 | D0.X10 | D0.X10.AP | S_SMS1 | S_SMS3 | AP1 | AP3 | THE ONLY X10 CONNECTION IS AP |
| ROW 9 | D0.RF | D0.RF | S_RF1 | S_RF1 | RF1 | RF1 | |

| TO (POGO PIN) | CONN NAME | DEF | FROM (TESTER) | CONNECT | DISCONNECT | COMMENT |
|---|---|---|---|---|---|---|
| S_SMS1 | F_10 MHZ | X | SMS1 | +K1 | -K1 | 10 MHZ FILTER ON SMS 1 |
|  | F_100 MHZ |  | SMS1 | +K2 | -K2 | 100 MHZ FILTER ON SMS 1 |
|  | AP | X | AP1 | +K3 | -K3 | AP CONNECTION TO S_SMS 1 |
| S_SMS2 | F_10 MHZ | X | SMS2 | +K4 | -K4 |  |
|  | F_100 MHZ |  | SMS2 | +K5 | -K5 |  |
|  | AP | X | AP2 | +K6 | -K6 |  |
| S_SMS3 | F_10 MHZ | X | SMS3 | +K7 | -K7 |  |
|  | F_100 MHZ |  | SMS3 | +K8 | -K8 |  |
|  | AP | X | AP3 | +K9 | -K9 |  |
| S_SMS4 | F_10 MHZ | X | SMS4 | +K10 | -K10 |  |
|  | F_100 MHZ |  | SMS4 | +K11 | -K11 |  |
|  | AP | X | AP4 | +K12 | -K12 |  |
| S_RF1 |  |  | RF1 |  |  |  |
| S_RF2 |  |  | RF2 |  |  |  |

| TO (PIN) | PPID | X | Y | SHAPE | TYPE | CONN NAME | RES/ SITE | SITE | CON-NECT | DIS-CON-NECT | FROM (POGO PIN) | PATHS | COMMENT |
|---|---|---|---|---|---|---|---|---|---|---|---|---|---|
| D0 | 1 | 0 | 120 | ROUND | BID | DP | PER SITE | 1 | +K5 | -K5 | 1 | DP, CPMU | DIRECT CONNECTION TO DP AND VIA THE CPMU |
| | | | | | | | | 2 | +K6 | -K6 | 3 | | |
| | | | | | | X1 | PER SITE | 1 | +K1 | -K1 | S_SMS1 | F_10 MHZ, F_100 MHZ | DIRECT CONNECTION TO S_SMS |
| | | | | | | | | 2 | +K2 | -K2 | S_SMS3 | | |
| | | | | | | X10 | PER SITE | 1 | +K7 | -K7 | S_SMS1 | AP | X10 AMPLIFIED CONNECTION TO S_SMS |
| | | | | | | | | 2 | +K8 | -K8 | S_SMS3 | | |
| | | | | | | RF | RE-LAY-ED | 1 | +K3 | -K3 | S_RF1 | | PER SITE RELAYED CONNECTION TO RF |
| | | | | | | | | 2 | +K4 | -K4 | S_RF1 | | |
| D1 | 2 | 0 | 240 | ROUND | BID | DP | PER SITE | 1 | +K15 | -K15 | 2 | DP, CPMU | DIRECT CONNECTION TO DP AND VIA THE CPMU |
| | | | | | | | | 2 | +K16 | -K16 | 4 | | |
| | | | | | | X1 | PER SITE | 1 | +K11 | -K11 | S_SMS2 | F_10 MHZ, F_100 MHZ | DIRECT CONNECTION TO S_SMS |
| | | | | | | | | 2 | +K12 | -K12 | S_SMS4 | | |
| | | | | | | X10 | PER SITE | 1 | +K17 | -K17 | S_SMS2 | AP | X10 AMPLIFIED CONNECTION TO S_SMS |
| | | | | | | | | 2 | +K18 | -K18 | S_SMS4 | | |
| | | | | | | RF | RE-LAY-ED | 1 | +K13 | -K13 | S_RF2 | | PER SITE RELAYED CONNECTION TO RF |
| | | | | | | | | 2 | +K14 | -K14 | S_RF2 | | |
| D3 | 3 | 0 | 360 | ROUND | BID | | PER SITE | 1 | | | 5 | DP, CPMU | DIRECT CONNECTION TO DP AND VIA THE DP TO THE CPMU |
| | | | | | | | | 2 | | | 6 | | |
| D4 | 4 | 0 | 480 | ROUND | BID | | PER SITE | 1 | | | 8 | DP, CPMU | |
| | | | | | | | | 2 | | | 22 | | |

FIG. 5

|   | PIN NAME | FULLY QUALIFIED NAME | SCM POGO PIN | | TESTER RESOURCE | | COMMENT |
|---|---|---|---|---|---|---|---|
|   |   |   | SITE 1 | SITE 2 | SITE 1 | SITE 2 |   |
| ROW 1 | D0 | D0.DP.DP |   |   | D1 | D3 | D0 DEFAULTS TO THE FIRST DUT BOARD CONNECTION (DP) AND THE FIRST SCM CONNECTION (DP). |
| ROW 2 | D0.DP | D0.DP.DP |   |   | D1 | D3 | D0.DP SPECIFIES THE DP DUT BOARD CONNECTION. IT THEN DEFAULTS TO THE FIRST SCM CONNECTION (DP). |
| ROW 3 | D0.DP.DP | D0.DP.DP |   |   | D1 | D3 | FULLY SPECIFIED NAME |
| ROW 4 | D0.CPMU | D0.DP.CPMU |   |   | D1 | D3 | CPMU CONNECTION VIA D1/D3. SEE SECTION "CPMU CONNECTION" ON PG. 5 FOR MORE DETAILS ON THE CPMU. THE DP NAME IS NOT NECESSARY SINCE THERE IS ONLY ONE CPMU SCM CONNECTION NAME. |
| ROW 5 | D0.F_10 MHZ | D0.X1.F_10 MHZ | S_SMS1 | S_SMS3 | SMS1 | SMS3 | THE X1 DUT BOARD CONNECTION IS USED AS IT IS THE ONLY ONE TO F_10 MHZ |
| ROW 6 | D0.X1 | D0.X1.F_10 MHZ | S_SMS1 | S_SMS3 | SMS1 | SMS3 | THE X1 CONNECTION DEFAULTS TO THE FIRST SCM CONNECTION WHICH IS F_10 MHZ |
| ROW 7 | D0.AP | D0.X10.AP | S_SMS1 | S_SMS3 | AP1 | AP3 | THE ONLY AP CONNECTION IS VIA X10 |
| ROW 8 | D0.X10 | D0.X10.AP | S_SMS1 | S_SMS3 | AP1 | AP3 | THE ONLY X10 CONNECTION IS AP |
| ROW 9 | D0.RF | D0.RF | S_RF1 | S_RF1 | RF1 | RF1 |   |

FIG. 6

SYSTEM FOR AND METHOD OF PERFORMING DEVICE-ORIENTED TESTS

CROSS-REFERENCE TO RELATED APPLICATIONS

Not Applicable

STATEMENT REGARDING FEDERALLY SPONSORED RESEARCH

Not Applicable

REFERENCE TO MICROFICHE APPENDIX

Not Applicable

BACKGROUND OF THE INVENTION

The present invention relates to generating signal paths through a switching network, and more particularly, to generating signal paths from a variety of test sources, through a switching network, to a Device Under Test (DUT), as a function of commands that are written in a language associated with, and descriptive of, the DUT. Such testing is also referred to herein as "device oriented testing."

Figure 1:
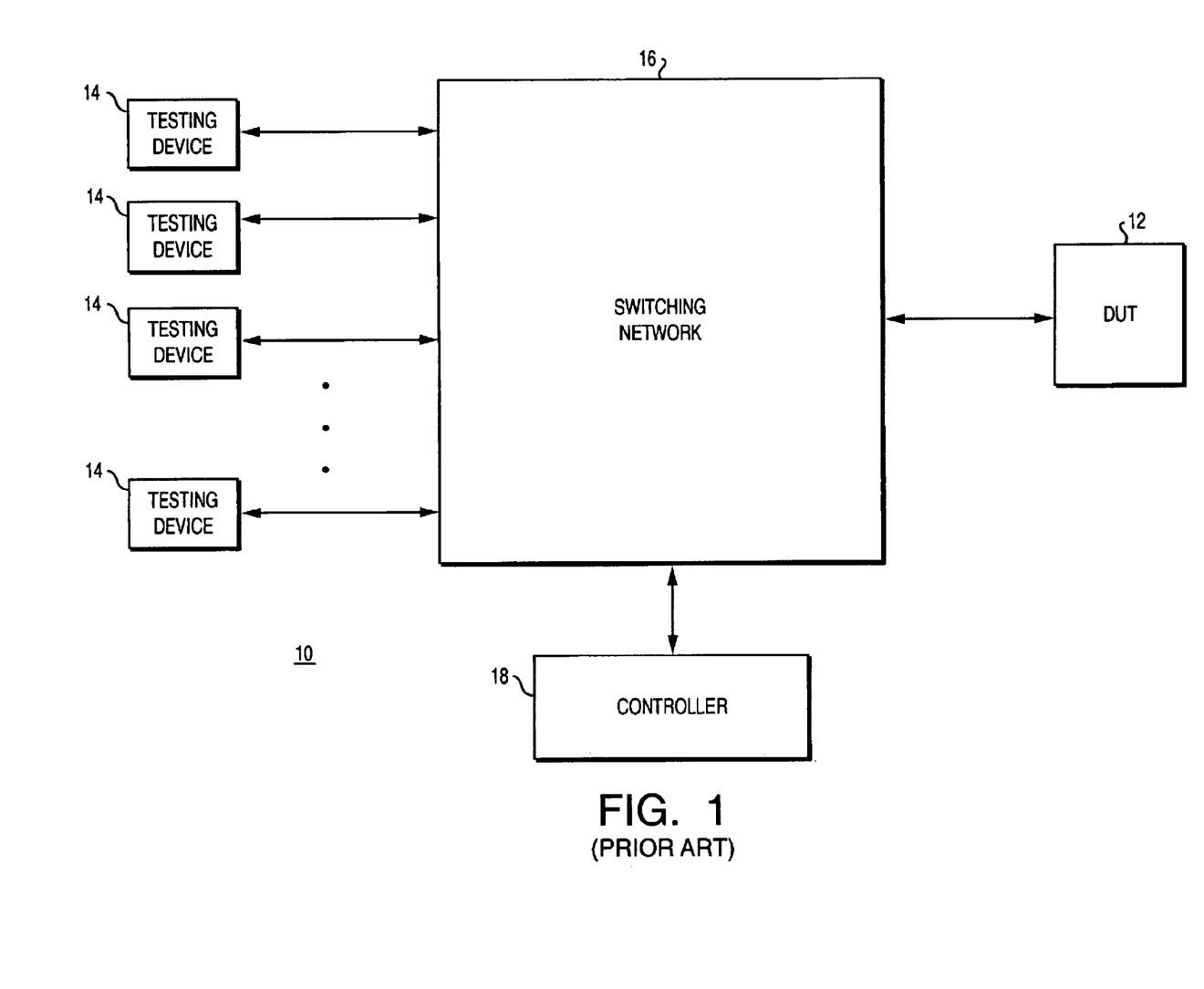
FIG. 1 shows an exemplary prior art testing system for testing an electrical device.

FIG. 1 shows an exemplary prior art testing system 10 for testing an electrical device 12 (also referred to herein as DUT). Such systems allow automatic testing of electrical devices in an efficient, repeatable manner, with little or no input from the person running the test. Such a testing system 10 has great utility for an electrical device manufacturer who produces a large number of devices each day that must be tested for functionality prior to being shipped. In general, such testing systems 10 include a plurality of testing devices 14 (also referred to herein as testing resources) that generate test signals to be applied to the DUT 12, and/or receive response signals from the DUT 12. The testing devices 14 that produce test signals also typically measure the signals as they are generated and record test signal measurements, and the testing devices 14 that receive the response signals measure the response signals and record the response measurements. The testing devices 14 are electrically coupled to a switching network 16, which is electrically coupled to the DUT 12. A controller 18 is electrically coupled to the switching network, and provides control signals to the switches (also referred to herein as relays) to selectively connect testing devices 14 to individual input/output (I/O) ports of the DUT 12. The switching network thus allows each I/O port of the DUT to be tested by multiple testing devices 14.

In typical prior art systems, the controller 18 is a computer system, and a test technician (also referred to herein as "the user") fashions test procedures for the DUT in code written on the computer. For example, the test technician may determine that one portion of the test procedure for a particular DUT 12 should be to connect a first testing device to each of the I/O ports of the DUT 12. For the first I/O port of the DUT 12, the technician must determine which relays of the switching network 16 must be closed to create a path from the testing device to the first I/O port. The technician then executes code on the computer that causes the computer to send control signals to the switching network 16, closing the relays that create a path from the testing device to the first I/O port. Once the first testing device completes the test of the first I/O port, the technician executes code that eliminates the path created by the previous step, and then executes further code to create a path from the first testing device to the second I/O port. This procedure repeats until all I/O ports of the DUT 12 have been connected to and tested by the first testing device.

One disadvantage to this procedure for testing a DUT is that it places a significant burden on the testing technician, especially when the DUT 12 has a large number of I/O ports, and when the switching network is complex and includes a large number of relays. For each path from a testing device to a DUT I/O port, the technician must determine which relays must be closed to implement the path, then write and execute code that closes those relays. Further, any changes in the testing procedure involves keeping track of which relays are already closed, which of those must be opened, and which open relays must be closed, in order to create the new path.

Another disadvantage to this procedure is that it adds a significant probability of incurring errors during testing. Because the test technician must resolve each path manually, occasionally the wrong path will be created due to an inevitable programming error, and the procedure will consequently not test that which was intended.

It is an object of the present invention to substantially overcome the above-identified disadvantages and drawbacks of the prior art.

SUMMARY OF THE INVENTION

The foregoing and other objects are achieved by the invention which in one aspect comprises a method of sequentially connecting one or more testing devices to I/O ports of a DUT through a switching network, so as to execute a predetermined testing procedure associated with the DUT. The method includes generating a switching network map defining one or more connections within the switching network necessary to implement each of a plurality of electrical paths from an input of the switching network to an output of the switching network, wherein each of the plurality of electrical paths is representative of a connection of one of the testing devices to one of the I/O ports of the DUT. The method further includes receiving one or more commands, wherein each of the commands uniquely specifies an electrical path connecting a particular testing device to a particular I/O port of the DUT. For each of the one or more commands, the method compares the command to the switching network map so as to identify a corresponding electrical path through the switching network, and implements the corresponding electrical path associated the command through the switching network. The method further includes sequentially implementing the electrical paths corresponding to the one or more commands in a predetermined order.

Another embodiment of the invention further includes assigning a unique path name to each of the electrical paths, such that each commands specifies a particular electrical path via the path name.

Another embodiment of the invention further includes sequentially implementing the electrical paths associated with the one or more commands through the switching network in an order corresponding to a chronological order of the one or more commands.

Another embodiment of the invention further includes opening and closing selected switching devices within the switching network.

Another embodiment of the invention further includes programming a computer system to issue the commands in the predetermined order.

Another embodiment of the invention further includes connecting one or more testing devices to multiple DUT sites via the switching network.

Another embodiment of the invention further includes associating each of the electrical paths with a name that is (i) descriptive of the path and (ii) related to DUT.

Another embodiment of the invention further includes

In another aspect, the invention comprises a system for sequentially connecting one or more testing devices to I/O ports of a DUT through a switching network, so as to execute a predetermined testing procedure associated with the DUT. The system includes a switching network map defining one or more connections within the switching network necessary to implement each of a plurality of electrical paths from an input of the switching network to an output of the switching network, wherein each of the plurality of electrical paths is representative of a connection of one of the testing devices to one of the I/O ports of the DUT;

a controller for (i) receiving one or more commands, wherein each of the commands uniquely specifies an electrical path connecting a particular testing device to a particular I/O port of the DUT, (ii) comparing each of the commands to the switching network map so as to identify a corresponding electrical path through the switching network, and implementing the corresponding electrical path associated the command through the switching network, and (iii) sequentially implementing the electrical paths corresponding to the one or more commands in a predetermined order.

In another embodiment of the invention, the switching network includes at least two sub-networks electrically coupled so as to form the plurality of electrical paths.

In another embodiment of the invention, the sub-networks include an SCM and a DUT board.

In another embodiment of the invention, each of said one or more commands includes a pin name that is (i) descriptive of the path and (ii) related to DUT.

BRIEF DESCRIPTION OF DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENTS

Figure 2:
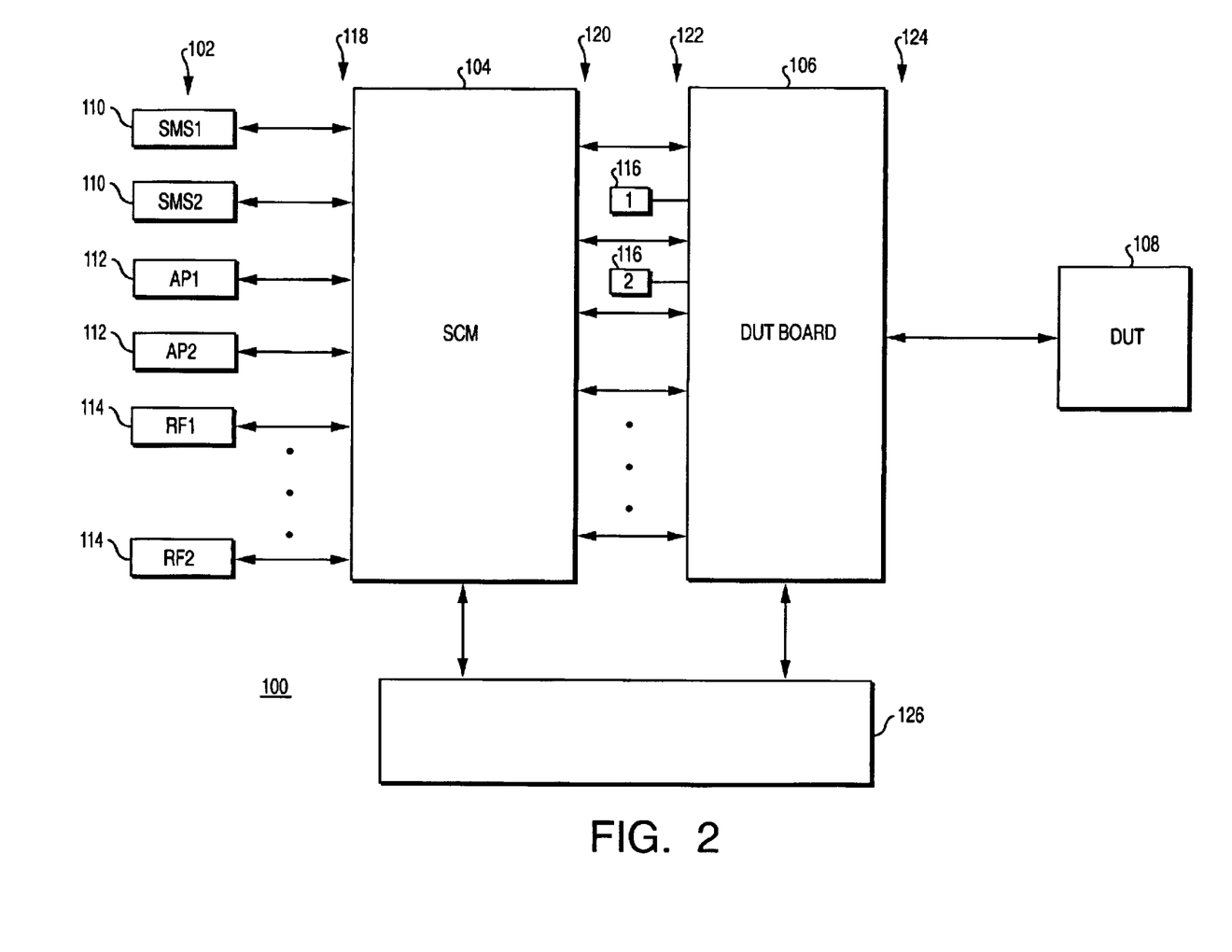
FIG. 2 shows a block diagram view of one preferred embodiment of a device oriented testing system according to the present invention.

FIG. 2 shows a block diagram view of one preferred embodiment of a device oriented testing system 100, including an array of testing resources 102, a System Configuration Module 104 (referred to herein as "SCM"), a DUT board 106 and a DUT 108. The testing resources 102 include waveform sources 110 that generate and measure time dependent voltage and current waveforms, referred to herein as "SMS" sources. An individual SMS source may be referred to herein as SMSN, where N is an integer (e.g., SMS1, SMS5, etc.). The testing resources 102 further include analog pin sources 112 (referred to herein as "APN," where N is an integer, e.g., AP2, AP7, etc.) that provide generic forcing and measuring of voltage and current signals. The testing resources 102 also include radio frequency sources 114 (referred to herein as "RFN," where N is an integer) that provide RF forcing and measuring of RF signals. The testing resources 102 may also include digital pin sources 116 (referred to herein as "DPN," or simply "N", where N is an integer) that provide discrete, digital signals, although such digital signals are preferably provided at the input of the DUT board 106, as shown in FIG. 2.

The SCM 104 includes input ports 118, output ports 120, and connections from the input ports 112 to the output ports 114. In input ports 118 are electrically coupled to the testing resources 102, and the output ports 120 are electrically coupled to the DUT board 106. The connections are electrical paths through the SCM 104, and may include direct wires, printed circuit traces, cables, transmission lines, and other means known to those in the art for implementing electrical paths. The connections may also include passive components (e.g., resistors), and active components (e.g., operational amplifiers). In alternate embodiments, the connections may implement the electrical paths indirectly, for example via fiber optics or acoustics, as long as the underlying signal is transmitted. The connections may be hardwired or switched. A switched connection depends upon the state of one or more relays (or other switching devices known to those in the art) in the path. A switched connection becomes active when all the switching devices are closed (i.e., electrically conductive). A switched connection becomes inactive when one or more of the switching devices in the path is opened (i.e., not electrically conductive). A connection that spans from an input port 112 to an output port 114 is referred to as a "complete path." A connection that spans only a portion of the SCM 104 is referred to as a "partial path." The concept of a partial path is useful in that two or more partial paths may be electrically coupled to form a complete path. An internal point at the beginning or the end of a partial or complete path is referred to herein as a "node." Nodes may represent fan-in and fan-out points of signals within a connection. The connections in the SCM 104 are preferably named. In the simplest case, the connection shares the name of one of the I/O ports of the DUT 108. In other cases, the connection name includes a string of partial path names within the SCM 104. For example, if a complete connection includes three partial paths A, B and C, the name of the complete path may be A.B.C.

The DUT board 106 is similar to the SCM 104 in that it includes input ports 122, output ports 124, and connections from the input ports 122 to the output ports 124. The characteristics of the DUT board connections are similar to the characteristic of the SCM connections described herein. On significant difference is that the DUT board 106 defines input resources across multiple DUT sites at the output. For example, in a case where the system 100 is testing a pair of DUTs, each DUT is referred to as a "site." For each I/O port (also referred to herein as "I/O pin") of the DUT 108, the DUT board 106 provides substantially identical signals to each of the sites, either by duplicating resources, or by sharing a resource via relay or other switching means known to those in the art. The input ports 122 of the DUT board 106 are electrically coupled to the output ports 120 of the SCM 104. The output ports 124 of the DUT board 106 are electrically coupled to the I/O pins of the DUT 108.

The testing system 100 further includes a controller 126 for controlling the connections through the SCM 104 and the DUT board 106. The controller 126 controls these connections by manipulating the individual switching devices within the connections, as described herein. The controller 126 preferably includes a computer or workstation, although other means for controlling switching devices know in the art may also be used. For example, the switching devices could be controlled via a simple state machine built into an ASIC device, or via a micro-controller, or even via a simple bank of switches. The controller 126 preferably includes a unique relay table associated with the SCM 104, and another unique relay table associated with the DUT board 106. Each of these relay tables defines the names of the switching devices within the associated switching network (i.e., either the SCM 104 or the DUT board 106), and defines what electrical signals are required to open and close each switching device.

Figure 3:
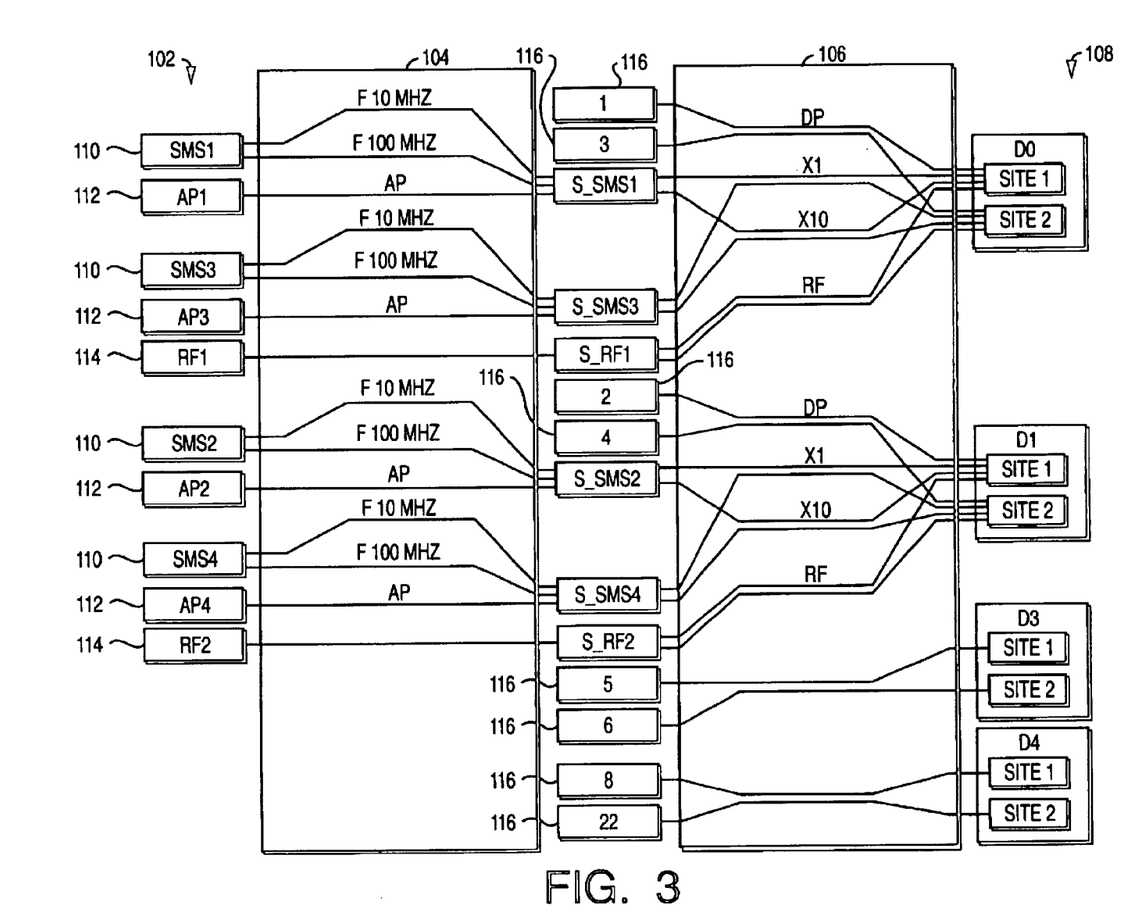
FIG. 3 shows another example of the device oriented testing system shown in FIG. 2.

FIG. 3 shows another example of the device oriented testing system 100 shown in FIG. 2. In the example shown in FIG. 3, named connections through the SCM 104 and the DUT board 106 are explicitly shown. FIG. 3 also shows the DUT board 106 providing output signals to dual sites. Each I/O port of a DUT 108 is labeled DN, where N is an integer. For each I/O port of the DUT 108 (e.g., D0), two sites are shown, labeled Site 1 and Site 2. FIG. 3 further shows an intermediate set of signal ports 130 between the SCM 104 and the DUT board 106. In a preferred embodiment of the invention, these intermediate signal ports 130 are in the form of "pogo pins" that provide the electrical interface between the SCM 104 and the DUT board 106.

Figure 4:
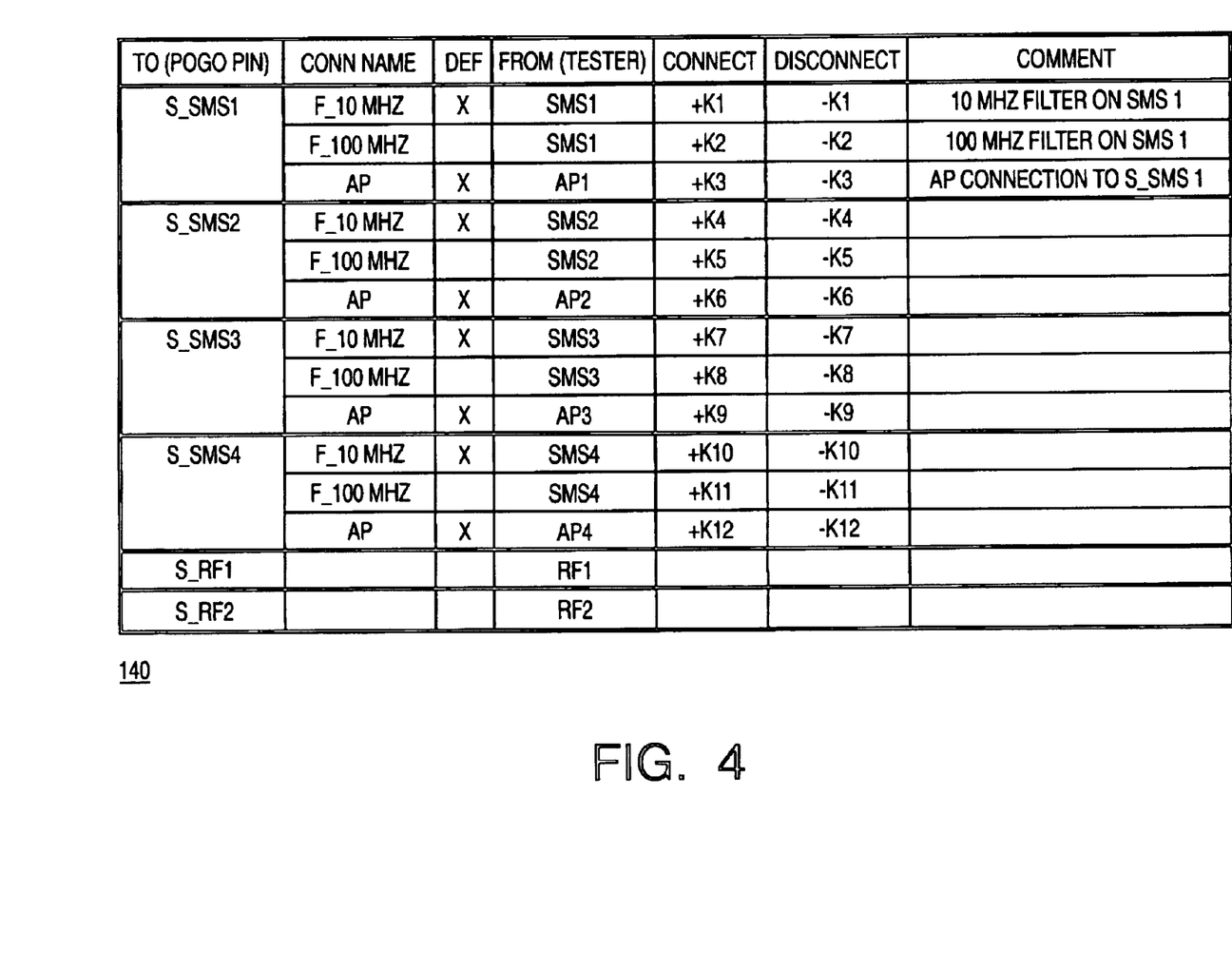
FIG. 4 shows an exemplary SCM map corresponding to the SCM of FIG. 3.

The controller 126 also preferably includes an SCM map 140 that defines the connections on the SCM 104 and the pogo pins that are available to the DUT board 106. In general, the SCM map 140 is a switching network map that defines one or more connections through the SCM. An exemplary SCM map 140, associated with the SCM 104 of FIG. 3, is shown in FIG. 4. The "To" column defines the name of the pogo pin available to the DUT board 106. The "Conn Name" column defines the name given to the specific connection from the pogo pin back to the tester resource. This name can be left out if there is only one connection (as is the case for the RF pins in this example). Note that the connection names are not unique across different pogo pins. This allows them to be easily used in multi-site applications. Internally, the "To" name is used to make each connection name unique. The "From" column defines the tester resource 102 that is used for a particular connection. In some embodiments, a popup menu of possible tester resources could be available to a user to specify the resources in this column. The "Connect" column defines the activities that need to occur in order for the specified connection to be made. In the exemplary system of FIG. 3, all of the connections are made by throwing a single relay, e.g., the AP connection of S_SMS1 is established by closing the K3 relay. The "Disconnect" column defines the activities that need to occur in order for the specified connection to be disconnected, and has the same format as does the "Connect" column. The "Def" column is a checkbox that indicates which of the SCM connections are exported to the DUT board by default. Connections which are not checked must be explicitly specified by the user in order to be available.

Figure 5:
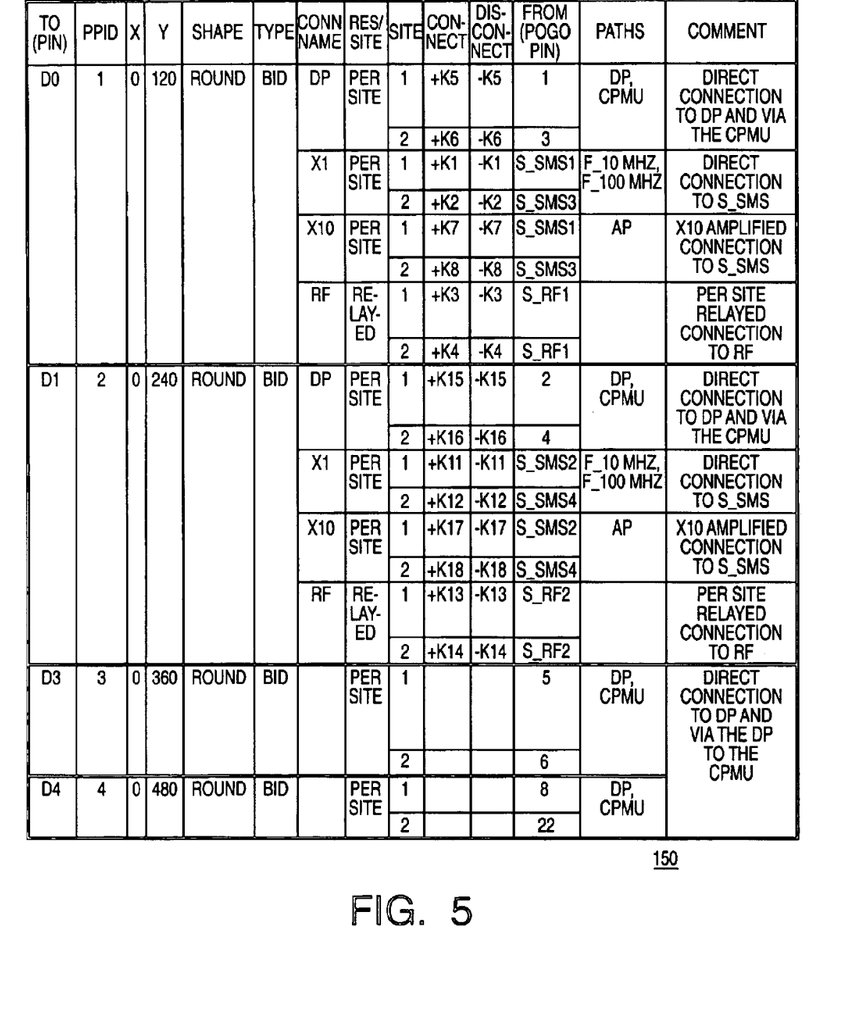
FIG. 5 shows an exemplary DUT board map corresponding to the DUT board of FIG. 3; and, FIG. 6 includes a table that shows several exemplary connections to the DUT via the present system.

The controller 126 also preferably includes an DUT board map 150 that defines the connections on the DUT board 106 and the outputs that are available to the DUT sites. Similar to the SCM 104 in FIG. 4, an exemplary DUT board map 150, associated with the DUT board 106 of FIG. 3, is shown in FIG. 5. The "To" column contains the name of the target I/O pin of the DUT 108. The "PPID", "X", "Y", "Shape", and "Type" columns contain attribute information relating to the I/O pins. The "Conn Name" column defines the name given to the specific connection from the device pin back to the SCM. This name may be omitted if there is only one connection, as is the case for I/O pins D3 and D4 in this example. As in the SCM map 140, the connection names for the DUT board map 150 need only be unique within a particular DUT pin (e.g., each connection name for D0 must be different, but D0 and D1 can, and should, use the same connection names for the same connections). The "Res/Site" column defines how the resources are shared between sites. One preferred embodiment includes three possible choices: 1. per site indicates that the resource is duplicated for each site; 2. relayed indicates that the resources is connected to each site in turn via relays; and 3. split indicates that the resource is fanned out to each site. The system 100 utilizes this "Res/Site" information to ascertain how to most efficiently implement the test. The "site" column indicates which site is being defined. The "Connect" column defines the activities that need to occur in order for the specified connection to be made. In this example, as with the SCM 104, all of the connections are made by throwing a single relay. Both the relays required to make the connection, any relays required to disconnect other resources should be specified here. The "Disconnect" column defines the activities that need to occur in order for the specified connection to be disconnected. It has the same format as does the "Connect" column. The "From" column defines the SCM output to which a particular I/O pin is connected. In some embodiments, a popup menu of possible SCM outputs could be available to a user to specify the resources in this column. Note that the digital resources are provided automatically. The "Paths" column is used to define the paths that are made available to the DUT I/O pin. The column defaults to the paths marked in the "Def" column from the SCM map 140, but can be edited to different values in some embodiments. Note that the "DP" in the Paths column refer to the connection that goes directly to the tester channel, not through any matrix, and the "DP" in the Connection Name column is just the name of the connection which can go direct to the tester channel via the "DP" or go through the DP Matrix using the Central Parametric Measurement Unit ("CPMU"). The CPMU is a central instrument that can measure voltages and currents more accurately than the Per Pin Measurement Units ("PPMU") on the individual pin cards.

Figure 6:
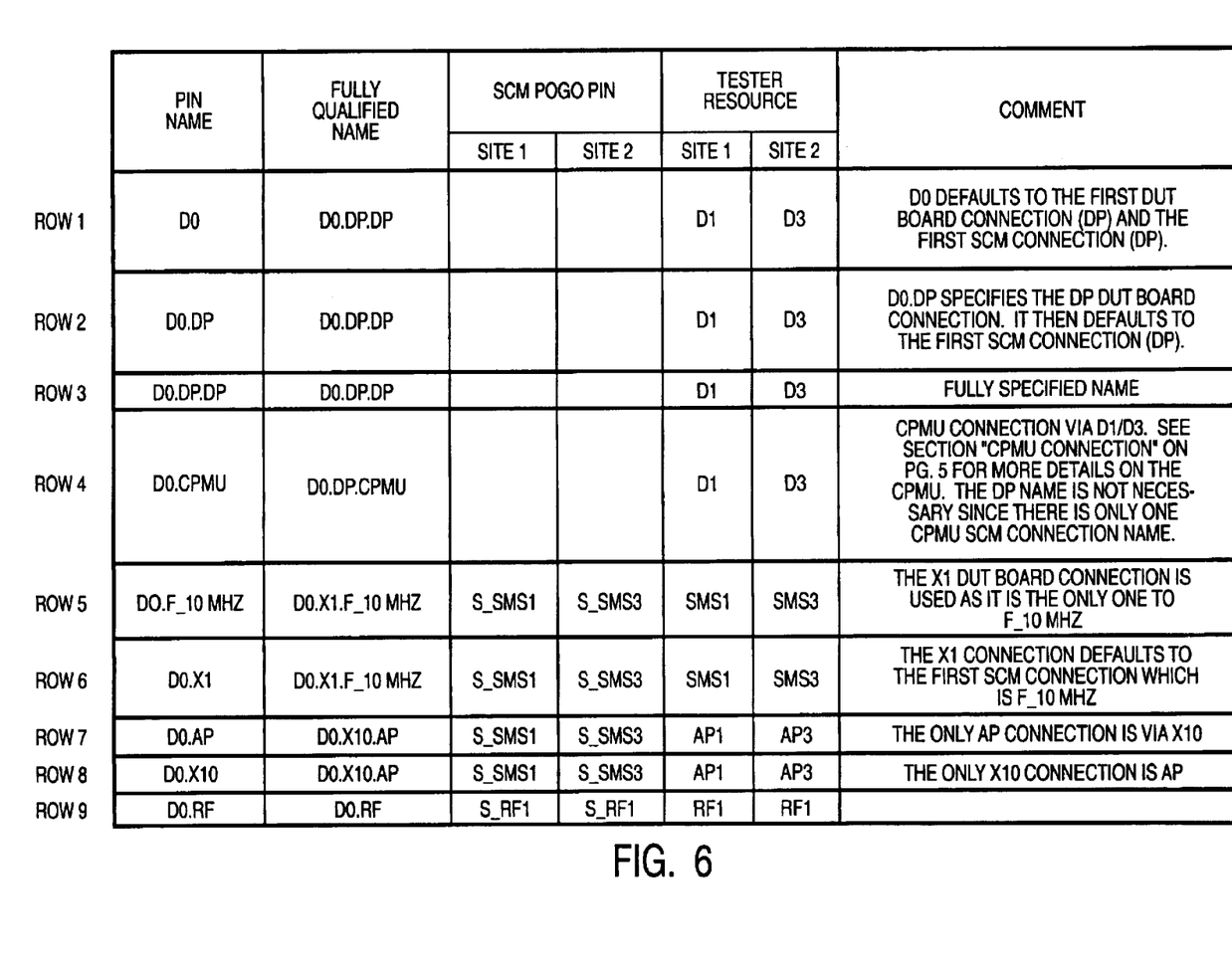

Using the information in the SCM map 140 and the DUT board map 150, the system 100 can refer to connections through the SCM 104 and the DUT board 106 by names that are logically associated with, and descriptive of, the DUT 108. For example, the table in FIG. 6 shows several exemplary connections to the DUT 108. The first three rows of the table in FIG. 6 represent three equivalent ways to specify the connection of a digital pin source to a DUT I/O port. As the comment for the first row explains, when less than the fully qualified name is specified, the system 100 uses predetermined defaults to establish a complete path from the digital pin source to the DUT I/O port. Equivalently, as shown in the third row, the fully qualified name may be used to define the same connection. Thus, a user may specify a connection from a digital pin source to a DUT pin by simply designating the DUT pin name. The system 100 uses the SCM map 140 and the DUT map 150 to determine, based upon the designated DUT pin name, which switching devices should be opened and which switching devices should be closed to effect the associated connection. Another example is shown in row 5 of the table in FIG. 6, in which a connection from the test source SMS1, through a 10 Mhz filter on the SCM 104, and through an X1 path on the DUT board 106 to site 1 of D0, is specified with the pin name D0.F_10 Mhz. Since the exemplary architecture shown in FIG. 3 services a dual site DUT, specifying D0.F_10 Mhz also establishes a connection from the test source SMS3, through a 10 Mhz filter on the SCM 104, and through an X1 path on the DUT board 106 to site 2 of D0. The utility of the system 100 is that the person developing the test procedure for the DUT 108 (hereinafter referred to as "the user") does not have to be cognizant of which relays must be exercised in the SCM 104 and the DUT board 106 to effect a particular connection. In comparable prior art systems, in order to establish a connection, the user would have to determine which relays were in the path of the connection, and write code that when executed, would exercise those switching devices and establish the connection. By contrast, the user of the present invention merely specifies a pin name that is descriptive of the desired connection, and the system 100 automatically exercises the switching devices necessary to effect the connection.

Another useful aspect of the present invention is the nature of the output of the SCM 104. In particular, because the SCM 104 can network multiple testing resources 102 to a particular SCM output, each SCM output may be viewed as hybrid testing resource. For example, consider the SCM output S_SMS1 in FIG. 3. This single SCM output can provide a 10 MHz filtered version of SMS1, a 100 MHz filtered version of SMS1, and a direct connection to analog pin AP1. Again, the user does not need to be cognizant of how the SCM 104 connects the desired source to the SCM output, but rather only needs to specify a descriptive output name to effect the desired connection through the SCM 104.

The controller 126 further provides a user interface to allow a user to designate a series connections, from test resources 102 to the DUT 108, to be established by specifying pin names associated with those connections. The user also preferably specifies a connection sequence along with the connection names. The connection sequence defines the order in which the controller should establish the specified connections, and whether prior connections should be disconnected before any particular connection is established. In one preferred embodiment, the user provides the pin names that designate connections, along with the connection sequence, by submitting instructions or commands to the controller 126 that uniquely specify connections from the test resources to the DUT. 108.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A method of sequentially connecting one or more testing devices to I/O ports of a DUT through a switching network, so as to execute a predetermined testing procedure associated with the DUT, comprising:

generating a switching network map defining one or more connections within the switching network necessary to implement each of a plurality of electrical paths from an input of the switching network to an output of the switching network, wherein each of the plurality of electrical paths is representative of a connection of one of the testing devices to one of the I/O ports of the DUT;

receiving one or more commands, wherein each of the commands uniquely specifies an electrical path connecting a particular testing device to a particular I/O port of the DUT; and, for each of the one or more commands, comparing the command to the switching network map so as to identify a corresponding electrical path through the switching network, and implementing the corresponding electrical path associated with the command through the switching network; and, sequentially implementing the electrical paths corresponding to the one or more commands in a predetermined order.

2. A method according to claim 1, further including assigning a unique path name to each of the electrical paths, such that each command specifies a particular electrical path via the path name.

3. A method according to claim 1, further including sequentially implementing the electrical paths associated with the one or more commands through the switching network in an order corresponding to a chronological order of the one or more commands.

4. A method according to claim 1, wherein sequentially implementing the electrical paths further includes opening and closing selected switching devices within the switching network.

5. A method according to claim 1, further including programming a computer system to issue the commands in the predetermined order.

6. A method according to claim 1, further including connecting one or more testing devices to multiple DUT sites via the switching network.

7. A method according to claim 1, further including associating each of the electrical paths with a name that is (i) descriptive of the path and (ii) related to the DUT.

8. A system for sequentially connecting one or more testing devices to I/O ports of a DUT through a switching network, so as to execute a predetermined testing procedure associated with the DUT, comprising:

a switching network map defining one or more connections within the switching network necessary to implement each of a plurality of electrical paths from an input of the switching network to an output of the switching network, wherein each of the plurality of electrical paths is representative of a connection of one of the testing devices to one of the I/O ports of the DUT;

a controller for (i) receiving one or more commands, wherein each of the commands uniquely specifies an electrical path connecting a particular testing device to a particular I/O port of the DUT, (ii) comparing each of the commands to the switching network map so as to identify a corresponding electrical path through the switching network, and implementing the corresponding electrical path associated with the command through the switching network, and (iii) sequentially implementing the electrical paths corresponding to the one or more commands in a predetermined order.

9. A system according to claim 8, wherein the switching network includes at least two sub-networks electrically coupled so as to form the plurality of electrical paths.

10. A system according to claim 9, wherein said sub-networks include an SCM and a DUT board.

11. A system according to claim 8, wherein each of said one or more commands includes a pin name that is (i) descriptive of the path and (ii) related to the DUT.

* * * * *